(12) United States Patent
Kuo et al.

(10) Patent No.: US 8,315,079 B2
(45) Date of Patent: Nov. 20, 2012

(54) CIRCUIT FOR CONCURRENT READ OPERATION AND METHOD THEREFOR

(75) Inventors: Harry Kuo, Cupertino, CA (US); Hagop Nazarian, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 215 days.

(21) Appl. No.: 12/900,232

(22) Filed: Oct. 7, 2010

(65) Prior Publication Data

US 2012/0087169 A1  Apr. 12, 2012

(51) Int. Cl.
*G11C 7/06* (2006.01)

(52) U.S. Cl. ............ 365/72; 365/63; 365/148; 365/158; 365/163

(58) Field of Classification Search .................... 365/100
See application file for complete search history.

(56) References Cited

U.S. PATENT DOCUMENTS

| | | | |
|---|---|---|---|
| 5,499,208 A | 3/1996 | Shoji | |
| 5,673,223 A | 9/1997 | Park | |
| 5,923,587 A | 7/1999 | Choi | |
| 6,897,519 B1 | 5/2005 | Dosluoglu | |
| 7,251,152 B2 | 7/2007 | Roehr | |
| 7,561,461 B2 * | 7/2009 | Nagai et al. | 365/148 |
| 7,746,696 B1 | 6/2010 | Paak | |
| 7,764,536 B2 * | 7/2010 | Luo et al. | 365/158 |
| 8,243,542 B2 * | 8/2012 | Bae et al. | 365/203 |
| 2009/0251941 A1 | 10/2009 | Saito | |
| 2010/0067279 A1 | 3/2010 | Choi | |
| 2010/0102290 A1 | 4/2010 | Lu et al. | |
| 2010/0171086 A1 | 7/2010 | Lung et al. | |
| 2010/0182821 A1 | 7/2010 | Muraoka et al. | |
| 2011/0066878 A1 * | 3/2011 | Hosono et al. | 714/6.1 |
| 2012/0074507 A1 | 3/2012 | Jo et al. | |

OTHER PUBLICATIONS

Office Action for U.S. Appl. No. 12/815,318 dated May 16, 2012.
International Search Report for PCT/US2011/046036 filed on Jul. 29, 2011.
Written Opinion of the International Searching Authority for PCT/US2011/046036 filed on Jul. 29, 2011.
Notice of Allowance for U.S. Appl. No. 13/051,296 dated Aug. 31, 2012.

* cited by examiner

*Primary Examiner* — Tan T. Nguyen
(74) *Attorney, Agent, or Firm* — Ogawa P.C.

(57) ABSTRACT

A non-volatile memory device includes an array of memory units, each having resistive memory cells and a local word line. Each memory cell has a first and a second end, the second ends are coupled to the local word line of the corresponding memory unit. Bit lines are provided, each coupled to the first end of each resistive memory cell. A plurality of select transistors is provided, each associated with one memory unit and having a drain terminal coupled to the local word line of the associated memory unit. First and second global word lines are provided, each coupled to a control terminal of at least one select transistor. First and second source lines are provided, each coupled to a source terminal of at least one select transistor. The memory device is configured to concurrently read out all resistive memory cells in one selected memory unit in a read operation.

20 Claims, 6 Drawing Sheets

CIRCUIT FOR CONCURRENT READ OPERATION AND METHOD THEREFOR

CROSS-REFERENCES TO RELATED APPLICATIONS

Not Applicable

BACKGROUND OF THE INVENTION

The present invention relates to a resistive memory array architecture including resistive memory cells, in particular to a circuit and method for concurrently reading a plurality of memory cells in a resistive memory device.

Resistive random-access memories (RRAMs) are a type of resistive memory and have generated significant interest recently as a potential candidate for ultra-high density non-volatile information storage. A typical RRAM device has an insulator layer provided between a pair of electrodes and exhibits electrical pulse induced hysteretic resistance switching effects.

The resistance switching has been explained by the formation of conductive filaments inside the insulator due to Joule heating and electrochemical processes in binary oxides (e.g. NiO and $TiO_2$) or redox processes for ionic conductors including oxides, chalcogenides and polymers. The resistance switching has also been explained by field assisted diffusion of ions in $TiO_2$ and amorphous silicon (a-Si) films.

In the case of a-Si structures, electric field-induced diffusion of metal ions into the silicon leads to the formation of conductive filaments that reduce the resistance of the a-Si structure. These filaments remain after a biasing (or program) voltage is removed, thereby giving the device its non-volatile characteristic, and they can be removed by reverse flow of the ions back toward the metal electrode under the motive force of a reverse polarity applied voltage.

Resistive devices based on an a-Si structure, particularly that formed on polysilicon, typically exhibit good endurance or life cycle. However, the endurance of the resistive device can be shortened if excessive bias voltage is applied during the repeated write and erase cycles in part due to Joule heating and movements of an unnecessarily large number of metal ions in the a-Si structure. Furthermore, in general, RRAM device yield is affected by the electroforming process during which the major part of a conducting path is formed inside the insulating switching layer by applying larger voltage (or current) signal to the device.

RRAMs are commonly arranged in a crossbar array to obtain a high memory density. A memory device having a crossbar array typically requires pre-charging all of the memory cells to read one or more selected memory cells in order to limit the sneak paths and the amount of current leakage seen by the sensing circuits. This pre-charge requirement results in read out delays, increased read disturb, increased power consumption, and/or other disadvantages.

BRIEF SUMMARY OF THE INVENTION

The present invention relates to a non-volatile memory device and a circuit for performing a concurrent read operation. Embodiments of the present invention are directed to reading a plurality of resistive memory cells in a subgroup of a memory array in a memory device without pre-charging the non-selected resistive memory cells in the memory array. In an embodiment, a select transistor is assigned to each memory unit in the memory array, where each memory unit has a plurality of resistive memory cells. This select transistor and the resistive memory cells in the memory unit share a common node or a local word line. A read operation is performed on the memory unit basis. For example, all the resistive memory cells in a given memory unit are read concurrently by controlling the select transistor assigned thereto.

The term "concurrent" or "concurrently" as used herein in context of a read operation means that selected memory cells are read together in the same read operation and it does not necessarily mean that the selected memory cells are read out at exactly the same time.

In an embodiment, a plurality of resistive cells within a group (or memory unit) is read concurrently for a given read operation. Each group is assigned a select transistor. Each select transistor controls a plurality of resistive cells, where the resistive cells are commonly connected to a terminal (the drain) of the select transistor. The number of the resistive cells associated with a given group may vary depending on implementation.

In an embodiment, a non-volatile memory device concurrently reads a plurality of resistive memory cells in a selected memory unit without reading the memory cells in a non-selected memory unit in a given read operation.

In an embodiment, a non-volatile memory device includes a plurality of memory units provided in an array, each memory unit having a plurality of resistive memory cells and a local word line, each resistive memory units having a first end and a second end, the second ends of the resistive memory cells being coupled to the local word line. A plurality of bit lines is provided, each bit line being coupled to the first end of one of the resistive memory cells. A plurality of select transistors is provided, each select transistor being assigned to one of the memory units and having a drain terminal coupled to the local word line of the assigned memory unit. First and second global word lines are provided, each global word line being coupled to a control terminal of at least one select transistor. First and second source lines are provided, each source line being coupled to a source terminal of at least one select transistor. The non-volatile memory device further includes a sense amplifier unit including a plurality of sense amplifiers, each sense amplifier being associated with a plurality of bit lines and being configured to apply a read voltage to one of the bit lines to which the sense amplifier is associated according to an address received by the a sense amplifier unit.

In another embodiment, a method for reading a non-volatile memory device includes selecting a memory unit from a plurality of memory units provided in an array of the non-volatile memory device, each memory unit having a plurality of memory cells. A read voltage is applied to each of memory cells in the selected memory unit, each memory cell causing a signal to be output according to its resistive state. For example, if the memory cell is programmed, current flows through the memory cell when a read voltage applied thereto, which causes a sense amplifier to output a high voltage. On the other hand, if the memory cell is erased, current does not flow through the memory cell when the read voltage is applied, which causes the sense amplifier to output a low voltage. The plurality of the memory cells in the selected memory unit is read concurrently. In the present embodiment, the sense amplifier is a current sensing amplifier, but a voltage sensing amplifier may be used in other embodiments.

In an embodiment, the method further includes applying a voltage to a global word line that is coupled to a control terminal of a select transistor assigned to the memory unit.

In an embodiment, the method further includes applying a reference voltage to a plurality of bit lines coupled to a first terminals of the resistive memory cells to apply a read voltage to the memory cells in the memory unit.

Advantages of the present invention include one or more of the following: (1) reduce the overall current and power consumption by not having to pre-charge all the memory cells in an array; (2) eliminate or reduce the "pre-charge" phase of a read for a faster read operation; (3) simplify the circuit design since fewer biases would be required; (4) the bit lines used for reading would pre-charge to a closer absolute value since they are all adjacent to each other; (5) read disturb effect is reduced since all the memory cells in an array do not need to be pre-charged; and (6) redundancy scheme can be simplified since an array is divided into a plurality of memory units.

The details of one or more embodiments are set forth in the accompanying drawings and the description below. Other features, objects, and advantages will be apparent from the description and drawings, and from the claims.

BRIEF DESCRIPTION OF THE DRAWINGS

Exemplary embodiments will hereinafter be described in conjunction with the appended drawings, wherein like designations denote like elements, and wherein.

DETAILED DESCRIPTION OF THE INVENTION

The present invention relates to a non-volatile memory device and a circuit for performing a concurrent read operation.

Figure 1:
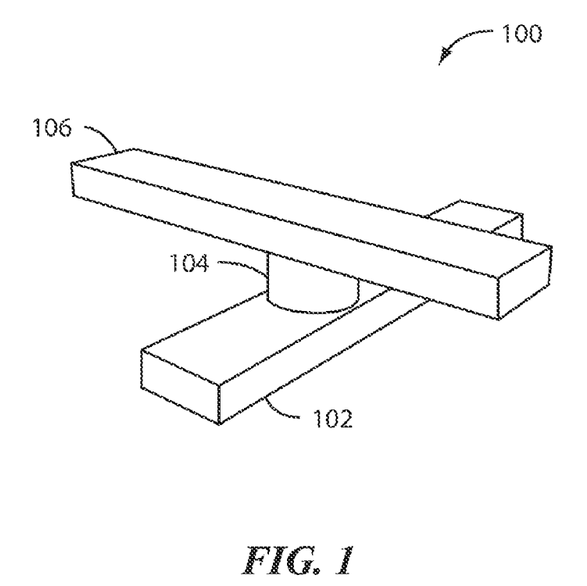
FIG. 1 illustrates a non-volatile memory device including a memory cell that has a bottom electrode, a switching medium, and a top electrode according to an embodiment of the present invention.

FIG. 1 illustrates a memory cell 100 in a non-volatile memory device, e.g., a semiconductor memory chip. The memory cell includes a bottom electrode 102, a switching medium 104, and a top electrode 106 according to an embodiment of the present invention. The switching medium 104 exhibits a resistance that can be selectively set to various values, and reset, using appropriate control circuitry. The cell 100 is a two-terminal resistive memory device, e.g., resistive random-access memory (RRAM), in the present embodiment.

The resistive memory cell is a two-terminal memory cell having a switching medium provided between top and bottom electrodes. The resistance of the switching medium can be controlled by applying an electrical signal to the electrodes. The electrical signal may be current-based or voltage-based. As used herein, the term "RRAM" or "resistive memory cell" refers to a memory cell or memory device that uses a switching medium whose resistance can be controlled by applying electrical signal without ferroelectricity, magnetization and phase change of the switching medium.

In the present embodiment, the memory cell 100 is amorphous-silicon-based resistive memory cell and uses amorphous silicon (a-Si) as the switching medium 104. The resistance of the switching medium 104 changes according to formation or retrieval of a conductive filament inside the a-Si switching medium according to a voltage applied. The top electrode 106 is a conductive layer containing silver (Ag) and acts as the source of filament-forming ions in the a-Si structure. Although silver is used in the present embodiment, it will be understood that the top electrode 106 can be formed from various other suitable metals, such as gold (Au), nickel (Ni), aluminum (Al), chromium (Cr), iron (Fe), manganese (Mn), tungsten (W), vanadium (V), and cobalt (Co). The bottom electrode 102 is a boron-doped or other p-type polysilicon electrode that is in contact with a lower end face of the a-Si structure.

Figure 2A:
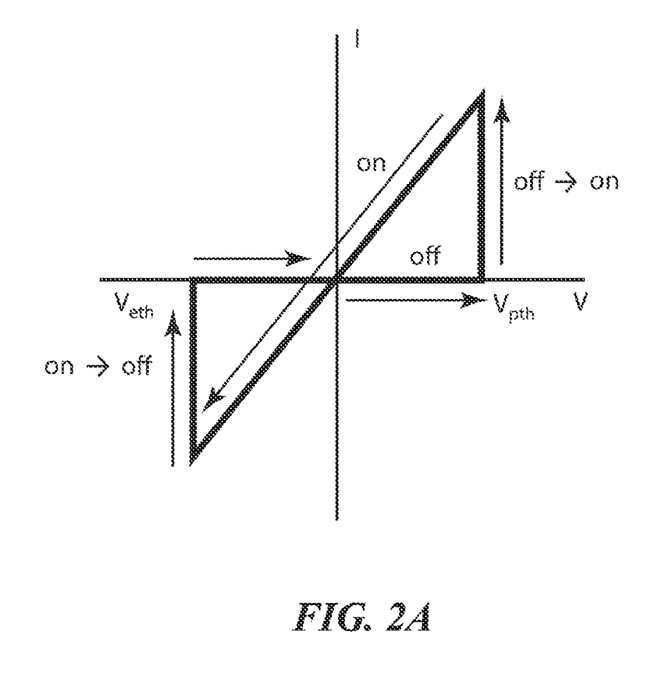
FIG. 2A illustrates resistance switching characteristics of a resistive memory cell according to an embodiment of the present invention.

FIG. 2A illustrates a resistance switching characteristics of the cell 100 according to an embodiment of the present invention. The switching medium 104 displays a bipolar switching mechanism. The resistance of the switching medium 104 changes depending on the polarity and magnitude of the current signal applied to the switching medium 104 via the top and bottom electrodes 106 and 102. The cell 100 is changed into ON-state (low resistance state) when a positive voltage equal to or greater than a program threshold voltage (or program voltage) $V_{pth}$ is applied. In an embodiment, the program voltage ranges between 2 volts to 5 volts depending on the materials used for the switching medium 104 and the top electrode 106. The cell 100 is switched back to OFF-state (high resistance state) when a negative voltage equal to or greater than an erase threshold voltage (or erase voltage) $V_{eth}$ is applied. In an embodiment, the erase voltage ranges from −2 volts to −5 volts. The cell state is not affected if the voltage applied is between two threshold voltages $V_{pth}$ and $V_{eth}$, which enables a low-voltage read process. Once the cell 100 is set to a specific resistance state, the cell 100 retains the information for a certain period (or retention time) without electrical power.

FIG. 2A illustrates non-rectifying switching characteristics of the cell 100 according to an embodiment of the present invention. Electrical current flows from the top electrode 106 to the bottom electrode 102 when the top electrode is applied with a positive potential with respect to the bottom electrode. On the other hand, the current flows in the reverse direction if the top electrode is applied with a negative potential with respect to the bottom electrode.

Figure 2B:
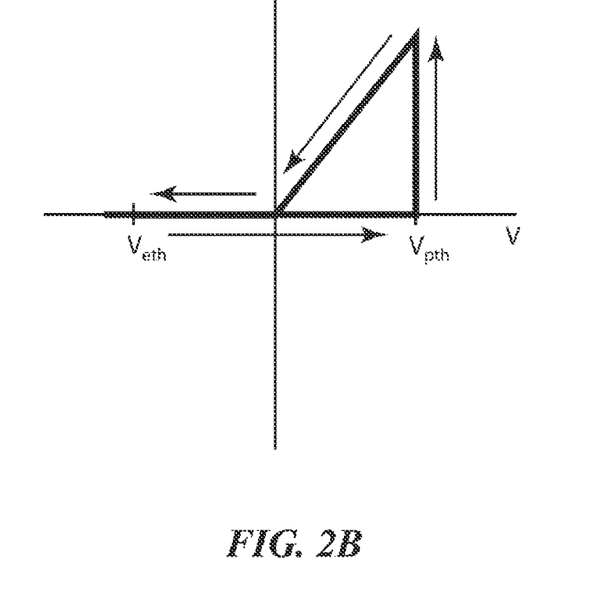
FIG. 2B illustrates resistance switching characteristics of a resistive memory cell according to an embodiment of the present invention.

FIG. 2B, on the other hand, illustrates rectifying switching characteristics of the cell 100 according to another embodiment of the present invention. Electrical current flows from the top electrode 106 to the bottom electrode 102 when the top electrode is applied with a positive potential with respect to the bottom electrode, but the current does not flow in the reverse direction even if the top electrode is applied with a negative potential with respect to the bottom electrode. Under this embodiment, the cell 100 exhibits a diode-like behavior and can be represented with an equivalent circuit including a resistor connected in series with a diode. The cell 100 can be controlled to exhibit either rectifying or non-rectifying characteristics by controlling the amount of current flowing through the cell as will be explained in more detail later.

Figure 3A:
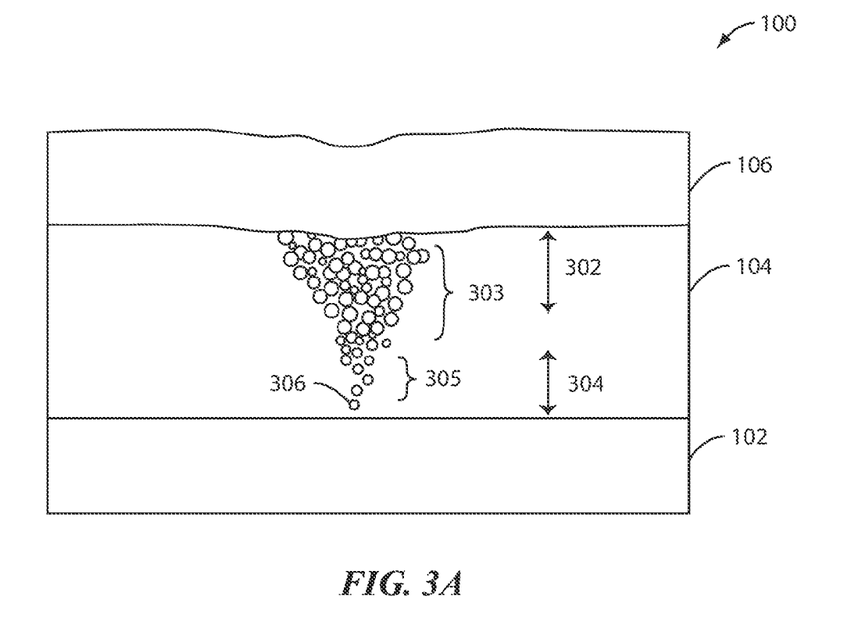
FIG. 3A illustrates a two-terminal memory cell that is placed in an ON state by applying a program voltage $V_{pth}$ to the top electrode.
Figure 3B:
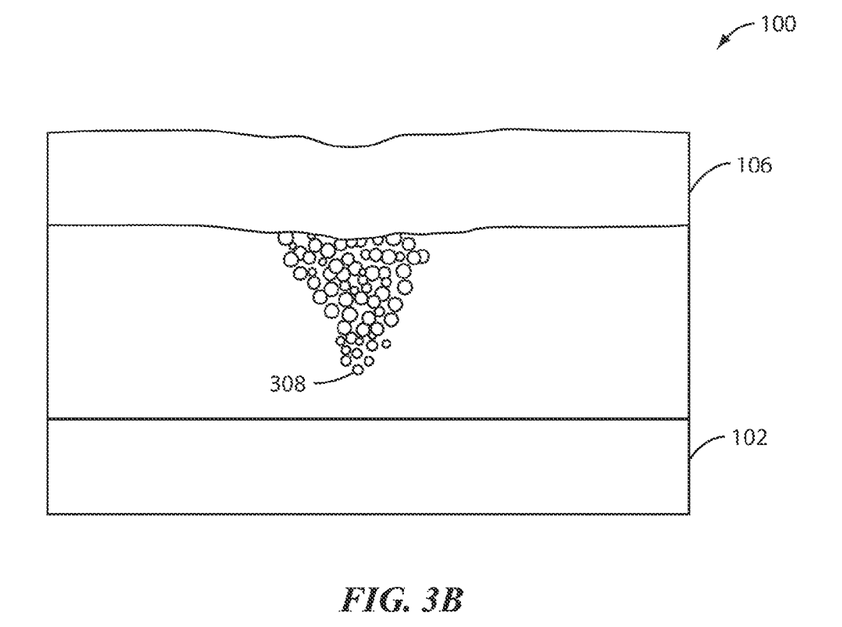
FIG. 3B illustrates a two-terminal memory cell that is placed in an OFF state by applying an erase voltage $V_{eth}$ to the top electrode.

FIGS. 3A and 3B illustrate a switching mechanism of the cell 100 during the ON and OFF states according to an embodiment of the present invention. The switching in the a-Si medium 104 is based on formation and retrieval of a conductive filament or a plurality of filaments in a filament region in the a-Si medium 104 according to the program and the erase voltages applied to the electrodes 102 and 106 of the cell 100.

FIG. 3A illustrates the cell 100 that is placed in the ON state by applying the program voltage $V_{pth}$ to the top electrode 106. The switching medium 104 made of a-Si is provided between the bottom electrode 102 and the top electrode 106. An upper portion of the switching medium 104 includes a metallic region (or conductive path) 302 that extends from the top electrode to about 10 nm above the bottom electrode 102. The metallic region 302 is formed during an electroforming process when a slightly larger voltage than a subsequent switching voltage, e.g., 3~5 V, is applied to the top electrode 106. This large voltage causes the electric field induced diffusion of the metal ions from the top electrode 106 toward the bottom electrode 102, thereby forming a continuous conductive path 303. A lower portion of the switching medium 104 defines a filament region 304 wherein a filament 305 is formed when the program voltage $V_{pth}$ is applied after the electroforming process. The regions 303 and 305 can be also formed together during the electroforming process. The filament 305 comprises a series of metal particles that are trapped in defect sites in a lower portion of the switching medium 104 when the program voltage $V_{pth}$ applied provides sufficient activation energy to push a number of metal ions from the metallic region 302 toward the bottom electrode 102.

The filament 305 is believed to be comprised of a collection of metal particles that are separated from each other by the non-conducting switching medium and does not define a continuous conductive path, unlike the path 303 in the metallic region 302. The filament 305 extends about 2-10 nm depending on implementation. The conduction mechanism in the ON state is electrons tunneling through the metal particles in the filament 305. The cell resistance is dominated by the tunneling resistance between a metal particle 306 and the bottom electrode 102. The metal particle 306 is a metal particle in the filament region 304 that is closest to the bottom electrode 102 and is the last metal particle in the filament region 304 in the ON state.

FIG. 3B illustrates the cell 100 that is placed in an OFF state by applying an erase voltage $V_{eth}$ to the top electrode. The erase voltage exerts sufficient electromagnetic force to dislodge the metal particles trapped in the defects sites of the a-Si and retrieves at least part of the filament from filament region 304. A metal particle 308 that is closest to the bottom electrode in the OFF state is separated from the bottom electrode by a distance greater than the metal particle 306 during the ON state. This increased distance between the metal particle 308 and the bottom electrode places the cell 100 in a high resistance state compared to the ON state. In an embodiment, the resistance ratio between the ON/OFF states ranges from 10E3 to 10E7. Cell 100 behaves like a resistor in the ON state and a capacitor in the OFF state (i.e., the switching medium does not conduct current in any meaningful amount and behaves as a dielectric in the OFF state). In an implementation, the resistance is 10E5 Ohm in the ON state and 10E10 Ohm in the OFF state. In another implementation, the resistance is 10E4 Ohm in the ON state and 10E9 Ohm in the OFF state. In yet another implementation, the resistance is at least 10E7 Ohm in the OFF state.

Referring back to FIGS. 2A and 2B, the cell 100 can be controlled to exhibit a diode-like behavior by controlling the amount of current flowing through the cell 100. If the amount of current flowing through the cell 100 is less than a threshold amount, the cell exhibits a diode-like behavior, thereby preventing a reverse current flow from the bottom electrode to the top electrode. In an embodiment, the threshold current is 10 μA so that the cell 100 exhibits non-rectifying characteristics (see FIG. 2A) if the amount of current is 10 μA or more and rectifying characteristics (see FIG. 2B) if the amount of current is less than 10 μA. The current threshold varies according to implementation, e.g., the materials used and the size of the cell.

It is believed that a negative potential applied to the bottom electrode 102 causes the metal particle 306 closest to the bottom electrode 102 (see FIG. 3A) to shift slightly upward without dislodging it from the filament region 304. The resulting increased distance between the metal particle 306 and the bottom electrode 102 increases the resistance and prevents the current from flowing from the bottom electrode to the metal particle 306. If the current, however, is equal to or greater than the threshold level, the large current bursts through the metal 306 from the bottom electrode.

Figure 4:
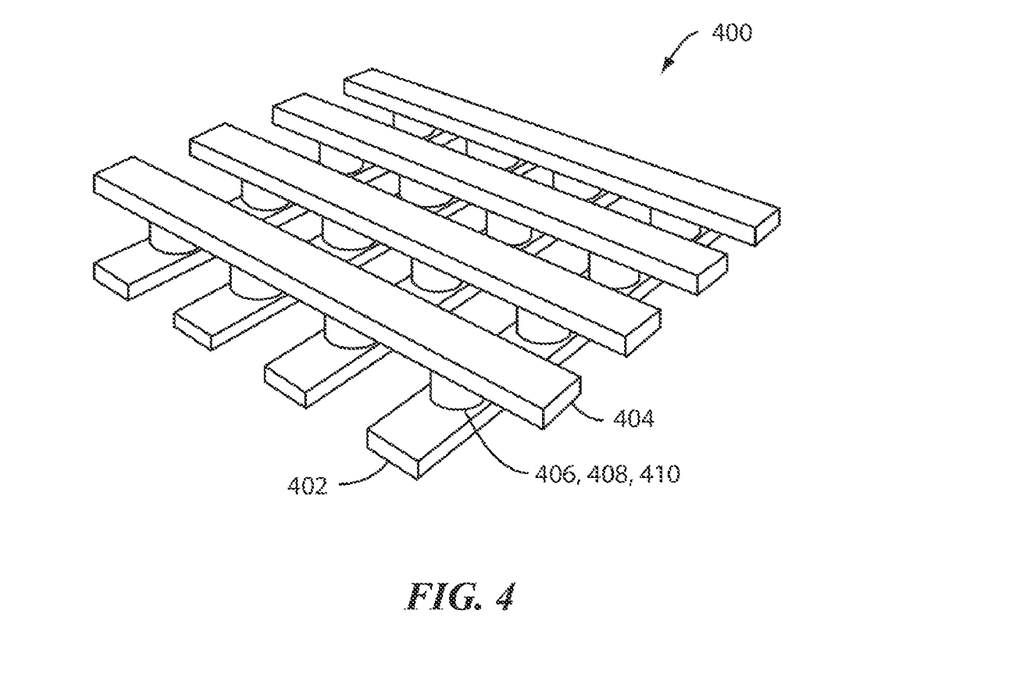
FIG. 4 illustrates a non-crystalline or amorphous silicon (a-Si) based crossbar memory array 400 according to an embodiment of the present invention.

FIG. 4 illustrates a non-crystalline or a-Si based crossbar memory array 400 according to an embodiment of the present invention. The crossbar memory array 400 includes a parallel array of bottom electrodes 402 extending along a first direction. In an embodiment, the bottom electrodes 402 includes a bottom metal (not shown) and a p-type polysilicon (not shown) formed on the bottom metal. The bottom electrodes 402 are nanoscale in the present embodiment. For example, the bottom electrodes 402 have a width of about 40 nm and a pitch of about 60 nm.

A parallel array of top electrodes 404 extends along a second direction to intersect the bottom electrodes 402. The top electrodes 404 include metals capable of supplying filament-forming ions such as silver (Ag), gold (Au), nickel (Ni), aluminum (Al), chromium (Cr), iron (Fe), manganese (Mn), tungsten (W), vanadium (V) and cobalt (Co). In an embodiment, the top electrodes 404 and the bottom electrodes 402 are orthogonal to each other. The top electrodes 404 are nanowires having a width of about 60 nm and a pitch of about 150 nm.

Each intersection 406 of the two arrays defines a two-terminal resistive memory cell 408. The memory cell 408 at each intersection 406 includes two electrodes separated by a switching layer 410. The switching layer or structure can be the same width or narrower than the bottom electrode. In some embodiments, each memory cell in a crossbar memory array can store a single bit. In other embodiments, the memory cells exhibit multi-level resistance thereby allowing storage of a plurality of bits at each cell.

In the present embodiment, the switching layer 410 includes amorphous silicon or other non-crystalline silicon. As used herein, the term "amorphous silicon" refers to silicon material that is in a substantially amorphous phase and may include small grains of crystalline silicon. As used herein, the term "non-crystalline silicon" refers to amorphous silicon or amorphous polysilicon that exhibits controllable resistance, a combination thereof, or the like.

The crossbar memory array as described above may be fabricated on a silicon substrate in an embodiment. In an embodiment, a silicon-germanium substrate is used. In another embodiment, III-V type semiconductor compounds (such as gallium arsenide (GaAs), gallium nitride (GaN), boron nitride (BN), etc.) or II-VI type semiconductor compounds (such as cadmium selenide, zinc telluride, etc.) may also be used as the substrate.

Figure 5:
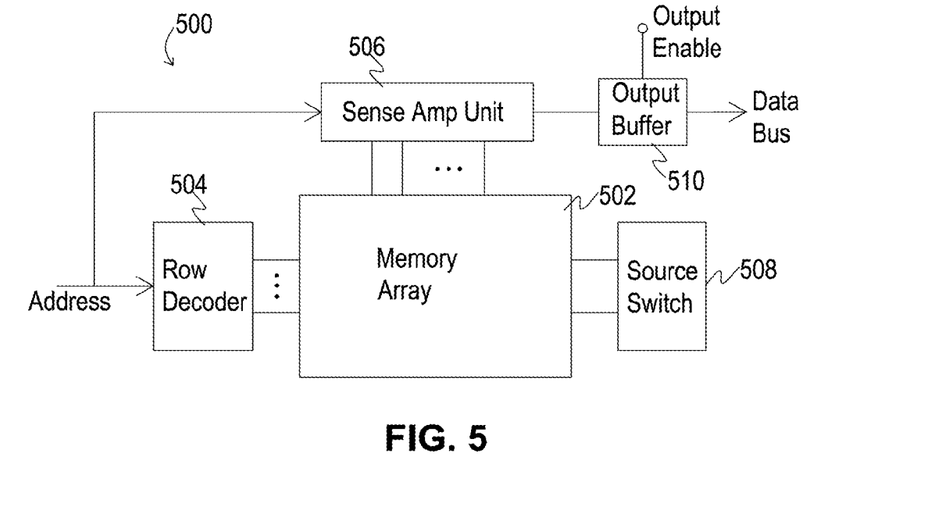
FIG. 5 illustrates a block diagram of a non-volatile memory device according to an embodiment of the present invention.

FIG. 5 illustrates a block diagram of a non-volatile resistive memory device 500 according to an embodiment of the present invention. Device 500 includes a memory array 502 including a plurality of memory units. Each memory unit is associated with a select transistor (see FIG. 6) and includes a plurality of resistive memory cells. A row decoder 504 receives the address of a resistive memory cell (or cells) to be operated on and selects the word line associated with the memory unit of the selected resistive memory cell (or cells). A control voltage, e.g., $V_{cc}$, is then applied to turn on the select transistor assigned to that memory unit. A sense amplifier unit 506 applies a read voltage concurrently to the cells in the selected memory unit to read these cells. A source switch 508 applies a voltage suitable for an operation to be performed on a source line of the selected memory unit. The sense amplifier unit senses the voltage output by each of the selected memory cells to determine whether or not it has been erased or programmed An output buffer 510 receives data sensed by the sense amplifier 506 and outputs the data to a data bus according to an output enable signal.

Figure 6:
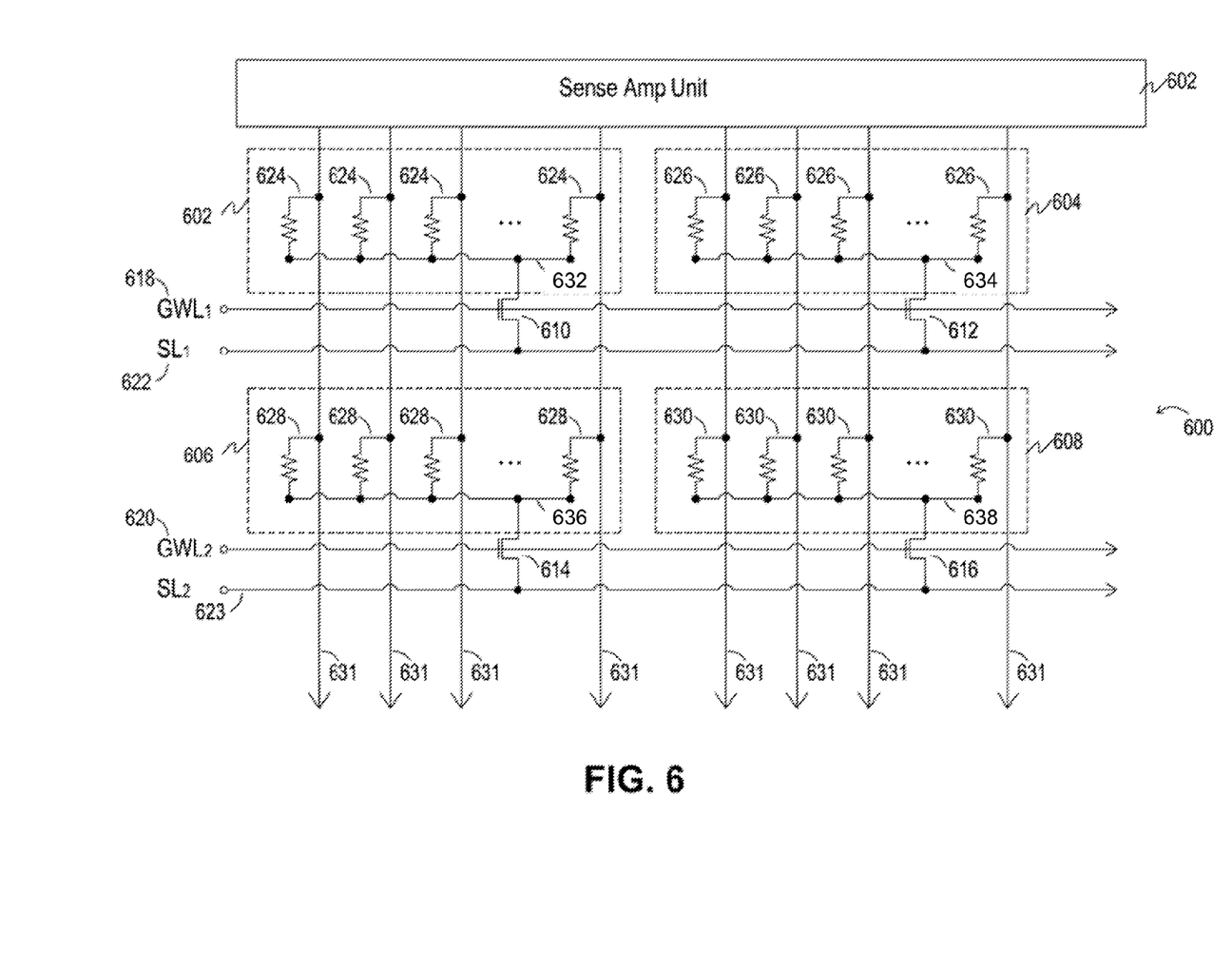
FIG. 6 illustrates a memory array including a plurality of memory units coupled to a sense amplifier unit according to an embodiment of the present invention.

FIG. 6 illustrates a memory array 600 coupled to a sense amplifier unit 602 according to an embodiment of the present invention. The memory array 600 includes a plurality of memory units 602, 604, 606, and 608. Although only four memory units are shown for illustrative convenience, a person skilled in art will appreciate that any reasonable number of memory units may be provided for the memory array according to implementation. In yet another embodiment, the memory array 600 may be a sub-array that is part of a larger array (not shown). In such a configuration, the sub-array 600 may be assigned a select transistor to select the sub-array for a read operation.

Referring back to FIG. 6, a plurality of select transistors 610, 612, 614, and 616 are assigned, respectively, to the memory units 602, 604, 606, and 608. A plurality of global word lines 618 and 620 extend along a given direction to couple the control terminals of the select transistors 610, 612, 614, and 616. The first global word line 618 is coupled to a first group of select transistors (or the select transistors 610 and 612). The second global word line 620 is coupled to a second group of select transistors (or the select transistors 614 and 616). A memory unit is selected for read operation in part by selecting a select transistor assigned to that memory unit by applying a voltage to one of the global word lines (or primary word lines) 618, 620.

A first source line 622 is coupled to the sources of the select transistors 610 and 612 in the first group. A second source line 623 is coupled to the sources of the select transistors 614 and 616 in the second group. In the present embodiment, the first global word line (or the second global word line) and the first source line (or the second source line) are coupled to the same group of select transistors. In another embodiment, the first global word line and the first source line are coupled to the select transistors in different groups, e.g., the first global word line is coupled to the gates of the transistors 610 and the first source line is coupled to the sources of the transistors 610 and 614.

Each memory unit 602, 604, 606, 608 includes a plurality of resistive memory cells 624, 626, 628, 630 for storing information. The resistive memory cell has a switching medium (not shown) provided between two electrodes and stores one or more bits depending on implementation. The resistance of the switching medium can be controlled by applying an electrical signal to the electrodes. The electrical signal may be current-based or voltage-based. An example of the resistive memory cell 624 is the memory cell 100 described previously.

In the present embodiment, eight resistive memory cells are provided for each memory unit. In another embodiment, sixteen resistive memory cells are provided for each memory unit. A person skilled in art will appreciate the number of resistive memory cells for each memory unit may vary according to implementation.

Each resistive memory cell has a first end coupled to a bit line 631 and a second end coupled to a local word line 632, 634, 636, 638. A local word line is provided for each memory unit. The drain of the select transistor assigned to that memory unit is connected to the corresponding local word line. Accordingly, all resistive memory cells in a memory unit are commonly connected to the local word line for that memory unit and share a common node with the drain of the corresponding select transistor.

The memory array 600 includes at least as many bit lines 631 as the number of resistive memory cells in a single memory unit. In an embodiment, the number of bit lines corresponds to the number of resistive memory cells arranged along a row.

The sense amplifier unit 602 includes a plurality of sense amplifiers (see FIG. 7A) for applying a read voltage to the bit lines selected for a read operation. In an embodiment, the number of sense amplifiers corresponds to the number of resistive memory cells in a memory unit so that the read voltage is applied concurrently to all the resistive memory cells in the memory unit selected for a read operation.

Figure 7A:
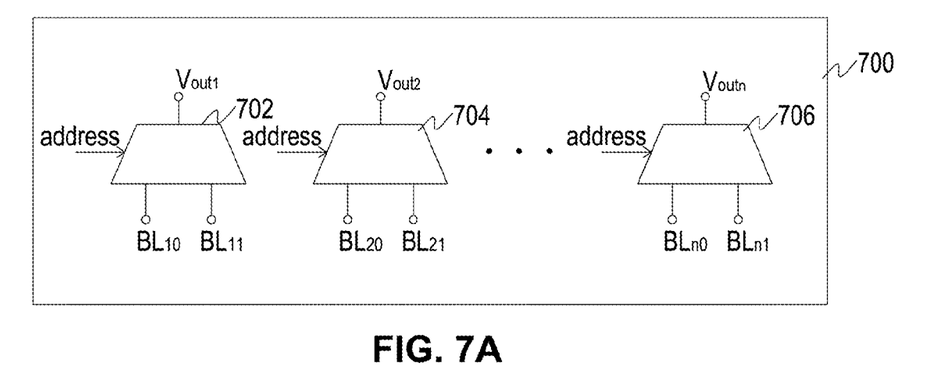
FIG. 7A illustrates a plurality of sense amplifiers provided within a sense amplifier unit according to an embodiment of the present invention.

FIG. 7A illustrates a plurality of sense amplifiers 702, 704, and 706 provided within a sense amplifier unit 700 according an embodiment of the present invention. The number of sense amplifiers provided within the sense amplifier unit 700 corresponds to the number of resistive memory cells provided in a memory unit. If eight resistive memory cells are provided within each memory unit, eight sense amplifiers are provided to apply the read voltage to the bit lines coupled to the eight resistive memory cells within the memory unit selected for a read operation. All eight resistive memory cells in the selected memory unit are read substantially at the same time in an embodiment of the present invention.

Each sense amplifier 702, 704, 706 controls the voltages being applied to the bit lines according to operations to be performed. The sense amplifier receives the address of the memory unit to be selected for a read operation. The sense amplifier outputs a read voltage to an even bit line $BL_{10}$, $BL_{20}$, $BL_{n0}$ or to an odd bit line $BL_{11}$, $BL_{21}$, $BL_{n1}$ according to the address received. Each sense amplifier is associated with two bit lines since two memory units are provided in a row in the embodiment illustrated in FIG. 7A. In other embodiments, each sense amplifier is associated with more than two bit lines. For example, each sense amplifier is associated with eight bit lines if a memory array has eight memory units in a row.

Figure 7B:
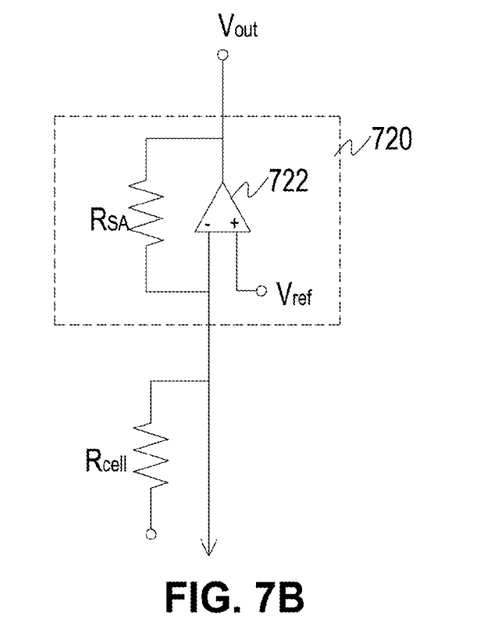
FIG. 7B illustrates a sense amplifier according to an embodiment of the present invention.

FIG. 7B illustrates a sense amplifier 720 according to an embodiment of the present invention. The sense amplifier 720 includes an amplifier 722 (or an op-amp) and a sense-amp resistor $R_{sa}$ (or a reference resistor). In an embodiment, the amplifier 722 is a current sensing amplifier (or a transimpedance amplifier) that is configured to output a voltage according to current sensed by the amplifier. The amplifier 722 has a first input terminal to receive a reference voltage $V_{ref}$ to generate a read voltage for the bit line selected for a read operation. The first input terminal is grounded or floated if the bit line is not selected for a read operation. A second input terminal is coupled to one end of a resistive memory cell $R_{cell}$ of a memory unit. The resistive memory cell $R_{cell}$ corresponds to a memory cell 100 in FIG. 1 (or that illustrated in FIG. 6). A sense resistor $R_{sa}$ has one end connected to the second input terminal of the amplifier 722 and the other end connected to an output terminal of the amplifier 722 to provide a feedback loop. The second terminal of the amplifier 722 and the feedback-loop of the sense resistor $R_{sa}$ cooperate together to provide a read voltage to the resistive memory cell $R_{cell}$ during a read operation.

The amplifier 722 outputs a low voltage if current does not flow through the resistive memory cell $R_{cell}$ (i.e., when the resistive memory cell is in an erased state) since the voltage difference between the first and second terminals would not change. The amplifier 722 outputs a high voltage if current flows through the resistive memory cell $R_{cell}$ (i.e., when the resistive memory cell is in a programmed state). The current flow causes the voltage of the second terminal to drop slightly, e.g., by 50 mV or less. Although a very slight drop in voltage, this would nevertheless increase the voltage difference between the first and second terminals and cause the amplifier 722 to output a high voltage. In the present embodiment, the voltage drop of the second terminal (i.e., a selected bit line) is kept to minimum in order to limit the voltage difference between a selected bit line and a non-select bit line, thereby limiting the sneak paths for current. The sneak paths increase in the memory array 600 if the bit lines are provided with substantially different voltage levels. In an embodiment, the amplifier 722 is a current sensing amplifier so that it can sense the resistive state of the resistive memory cell $R_{cell}$ without causing the bit lines to have substantially different voltage levels.

In an embodiment, the read voltage is 0.5V to 2 V, preferably about 1 V, and the reference voltage being inputted to the first input terminal is 0.7V. The read voltage may vary depending on implementation as long as the read voltage is less than the program voltage, so that the resistive state of the memory cells is not changed by the applied read voltage.

Referring back to FIGS. 5, 6, 7A, and 7B, a read operation according an embodiment of the present invention is described below. For illustrative convenience the components disclosed in the figures are assumed to belong to the same embodiment, e.g., the sense amplifier units 506, 602, and 700 are assumed to be referring to the same sense amplifier. The row decoder 504 and the sense amplifier unit 506 receive the address of a memory unit to be read. The memory unit to be read can be any memory unit in the memory array 502, 600. In the illustration herein, the memory unit to be read is the memory unit 602.

The row decoder activates the first global word line 618 and applies a voltage, e.g., $V_{cc}$, to turn on the select transistor 610 assigned to the first memory unit 602, so that the resistive memory cells in the memory unit 602 can be read out concurrently. The select transistor 612 that is in the same row as the select transistor 610 is also turned on. The resistive memory cells coupled to the select transistor 612 and assigned to the memory unit 604, however, will not be read since they will not be selected by the sense amplifier unit 602, as will be explained below. Accordingly, the bit lines associated with the memory cells 626 of the memory unit 604 do not need to be pre-charged to prevent the sneak paths. The second global word line 620 that has not been selected is grounded to keep the select transistors 614 and 616 turned off.

The sense amplifier unit 506, 602, 700 selects a memory unit to be activated based on the address received. That is, the sense amplifiers 702, 704, 706 select respectively the bit lines $BL_{11}$, $BL_{21}$, and $BL_{n1}$ that are coupled to the memory unit 602. A read voltage is applied to each of these bit lines. The bit lines $BL_{10}$, $BL_{20}$, $BL_{n0}$ not selected are grounded or floated. Accordingly, the resistive memory cells of the memory unit 604 are not activated for the read operation even though the select transistor 612 has been turned on by the global word line 618. In an embodiment, the read voltage is 2V or less, e.g., 1V, so that the resistive memory cells can be read without altering the resistive state of the resistive memory cells. The read voltage used may vary depending on implementation.

The first source line 622 coupled to the source of the select transistor 610 is grounded to provide a current path for the resistive memory cells of the memory unit 602 being read. The source of the select transistor 612 is also grounded, but this does not affect the read operation since the sense amplifier unit 602 only activates the bit lines coupled to the memory unit 602. The second source line 623 coupled to the select transistors 614 and 616 that are not selected may be grounded or floated according to the particular implementation.

In the present embodiment, the select transistors in the same row share the global word line and the source line. The row decoder 504 and the sense amplifier unit 506, 602, 700 are used, together, to ensure that only the resistive memory cells of the selected memory unit 602 are read out concurrently, not the resistive memory cells of the memory unit 604 that have not been selected.

In another embodiment, the memory units in a memory array may be arranged so that the select transistors do not share the global word lines and the source lines. For example, the select transistor 610 of the memory unit 602 would be coupled to the global word line 618 and the source line 622. The select transistor 612 of the memory unit 604 would be coupled to the global word line 618 and the source line 623. The select transistor 614 of the memory unit 606 would be coupled to the global word line 620 and the source line 622. The select transistor 616 of the memory unit 608 would be coupled to the global word line 620 and the source line 623. In this embodiment, the memory unit to be read out is selected primarily by selecting the desired select transistor.

Referring back to the present read operation, the resistive memory cells 624 in the memory unit 602 are read concurrently by the sense amplifier unit 602. Each memory cell 624 is provided with a read voltage. If the memory cell 624 in a low-resistance state, the read voltage applied to the bit line will cause the current to flow through the memory cell 624 and the select transistor 610 since the select transistor has been turned on and grounded. The sense amplifier 720 assigned to such a memory cell will output a high voltage. If the memory cell 624 in a high resistance state, the read voltage applied to the bit line will be insufficient to cause the current to flow through the memory cell 624 and thus no current would flow through the select transistor 610. The sense amplifier 720 assigned to such an erased memory cell will maintain a low output voltage.

Based on these voltage outputs by the sense amplifiers 720, the sense amplifier unit 700 determines the programmed or erased states of the memory cells in the selected memory unit. The sense amplifiers 720 that output a high voltage indicate that the corresponding memory cells are in a programmed state. The sense amplifiers 720 that output a low voltage indicate that the corresponding memory cells in an erased state. The memory cells 624 in the memory unit 602 are thus read concurrently.

A number of embodiments have been described. For example, the read algorithm disclosed herein may be extended to a pure crossbar array if the number of bits controlled by the transistor equals the total number of bits in a physical word line. The memory cells described herein have been resistive memory cells; however, other types of memory cells may be used, e.g., a phase change random access memory. A person skill in art will understand that various modifications may be made without departing from the spirit and scope of the invention.

What is claimed is:

1. A non-volatile memory device, comprising:
   a plurality of memory units provided in an array, each memory unit having a plurality of resistive memory cells and a local word line, each resistive memory units having a first end and a second end, the second ends of the resistive memory cells of each memory unit being coupled to the local word line of the corresponding memory unit;
   a plurality of bit lines, each bit line being coupled to the first end of one of the resistive memory cells;
   a plurality of select transistors, each select transistor being assigned to one of the memory units and having a drain terminal coupled to the local word line of the assigned memory unit;
   first and second global word lines, each global word line being coupled to a control terminal of at least one select transistor; and
   first and second source lines, each source line being coupled to a source terminal of at least one select transistor, wherein the memory device is configured to concurrently read out all of the resistive memory cells in one of the memory units selected for a read operation.

2. The memory device of claim 1, wherein each resistive memory cell includes first and second electrodes and a switching medium provided between the first and second electrodes, and wherein the resistive memory cells in the selected memory unit are read concurrently without pre-charging the bit lines coupled to the resistive memory cells in at least one of the memory units that is provided adjacent to the selected memory unit and is not selected for the read operation.

3. The memory device of claim 1, further comprising;
   a sense amplifier unit including a plurality of sense amplifiers, each sense amplifier being associated with a plurality of bit lines and being configured to apply a read voltage to one of the bit lines to which the sense amplifier is associated according to an address received by the a sense amplifier unit.

4. The memory device of claim 3, wherein the number of resistive memory cells in one of the memory units corresponds to the number of sense amplifiers provided within the sense amplifier unit, and wherein the sense amplifiers are current sensing amplifiers.

5. The memory device of claim 1, further comprising:
   a sense amplifier unit including a plurality of sense amplifiers, each sense amplifier being associated with a given number of the bit lines and being configured to apply a read voltage to read at least one of the resistive memory cells.

6. The memory device of claim 5, wherein all the resistive memory cells in the selected memory unit for the read operation are read concurrently by applying a voltage to the select transistor assigned to the selected memory unit.

7. The memory device of claim 1, wherein the sense amplifier includes a sense resistor and an amplifier having a first terminal to receive a reference voltage and a second terminal coupled to one of the bit lines, the sense resistor having a first end coupled to an output terminal of the amplifier and a second end coupled to the second terminal of the amplifier.

8. A method for reading a non-volatile memory device, the method comprising:
   selecting a memory unit from a plurality of memory units provided in an array of the non-volatile memory device, each memory unit having a plurality of resistive memory cells;
   applying a read voltage to each of memory cell in the selected memory unit, each memory cell causing a signal to be output according to its resistive state;
   sensing the output associated with each of the memory cells of the selected memory unit to determine whether or not the resistive memory cells are programmed or not;
   applying a voltage to a global word line that is coupled to a control terminal of a select transistor assigned to the memory unit; and
   wherein the resistive memory cells in the selected memory unit are read concurrently without pre-charging bit lines coupled to resistive memory cells in at least one of the memory units that is provided adjacent to the selected memory unit and is not selected for the read operation;
   wherein the plurality of the memory cells in the selected memory unit is read concurrently.

9. The method of claim 8, further comprising;
   grounding a source terminal of the select transistor assigned to the memory unit to provide a conducting path for the memory cells to be read.

10. The method of claim 8, further comprising;
    applying a reference voltage to a plurality of bit lines coupled to a first terminals of the resistive memory cells to apply a read voltage to the memory cells in the memory unit.

11. The method of claim 8, wherein the resistive memory cells are resistive memory cell, each resistive memory cells including first and second electrodes and a switching medium provided between the first and second electrodes.

12. The method of claim 8, wherein all the memory cells in each memory unit is commonly connected to a local word line.

13. The method of claim 12, wherein each local word line of a memory unit is coupled to a drain terminal of a select transistor that is assigned to the memory unit therefor.

14. The method of claim 8, wherein the outputs associated with the memory cells read are either a high or low voltage, the outputs being voltages output by sense amplifiers that are coupled to the resistive memory cells of the selected memory unit.

15. The method of claim 14, wherein a given memory cell read is determined to be programmed if the output associated with that memory cell is the high voltage and erased if the output associated with that memory cell is the low voltage.

16. The method of claim 8, wherein the output associated with the resistive memory cell is sensed using a current sensing amplifier.

17. A method for reading a non-volatile memory device, the method comprising;
    selecting a memory unit from a plurality of memory units provided in an array of the non-volatile memory device, each memory unit having a plurality of memory cells;
    applying a read voltage to each of memory cell in the selected memory unit, each memory cell causing a signal to be output according to its resistive state;
    sensing the output associated with each of the memory cells of the selected memory unit to determine whether or not the resistive memory cells are programmed or not; and grounding a source terminal of a select transistor assigned to the memory unit to provide a conducting path for the memory cells to be read; and wherein the plurality of the memory cells in the selected memory unit is read concurrently.

18. The method of claim 17, further comprising;

floating source terminals of select transistors assigned to memory units that are not selected for the read operation, and wherein the resistive memory cells in the selected memory unit are read concurrently without pre-charging bit lines coupled to resistive memory cells in at least one of the memory units that is provided adjacent to the selected memory unit and is not selected for the read operation.

19. The method of claim 17, further comprising;

grounding source terminals of select transistors assigned to memory units that are not selected for the read operation.

20. A method for reading a non-volatile memory device, the method comprising;

selecting a memory unit from a plurality of memory units provided in an array of the non-volatile memory device, each memory unit having a plurality of memory cells;

applying a read voltage to each of memory cell in the selected memory unit, each memory cell causing a signal to be output according to its resistive state; and sensing the output associated with each of the memory cells of the selected memory unit to determine whether or not the resistive memory cells are programmed or not;

wherein the plurality of the memory cells in the selected memory unit is read concurrently;

wherein the output associated with the resistive memory cell is sensed using a current sensing amplifier; and wherein the current sensing amplifier includes an input terminal coupled to one of the resistive memory cells of the selected memory unit, the input terminal configured to have a voltage drop of no more than 100 mV when the resistive memory cell coupled thereto transitions from a first resistive state to a second resistive state.

* * * * *